United States Patent [19]

Ashmore, Jr.

[11] Patent Number: 5,267,204

[45] Date of Patent: Nov. 30, 1993

[54] METHOD AND CIRCUITRY FOR MASKING DATA IN A MEMORY DEVICE

[75] Inventor: Benjamin H. Ashmore, Jr., Houston, Tex.

[73] Assignee: Texas Instruments Incorporated, Dallas, Tex.

[21] Appl. No.: 780,685

[22] Filed: Oct. 18, 1991

[51] Int. Cl.[5] .............................................. G06F 11/10
[52] U.S. Cl. ................................. 365/200; 371/21.2; 371/71
[58] Field of Search ..................... 371/21.1, 21.2, 22.5, 371/19, 16.1, 71; 365/200, 201

[56] References Cited

U.S. PATENT DOCUMENTS 3,768,071 10/1973 Knauft et al. ........................ 371/71
4,045,779 8/1977 Markle ................................. 365/200
4,615,030 9/1986 Kumagai ............................. 371/21.2

Primary Examiner—Eugene R. LaRoche
Assistant Examiner—Vu Le
Attorney, Agent, or Firm—Theodore D. Lindgren; Leo N. Heiting; Richard L. Donaldson

[57] ABSTRACT

A method and circuitry for masking data in a memory device are provided, which detect whether at least one failed bit location within the memory device is equal to a corresponding bit within input data. Data is written to the memory device as selectively inverted from the input data based upon whether the failed bit location is equal to the corresponding bit. An inversion bit within the memory device is selectively set to indicate whether the written data is inverted from the input data.

2 Claims, 5 Drawing Sheets

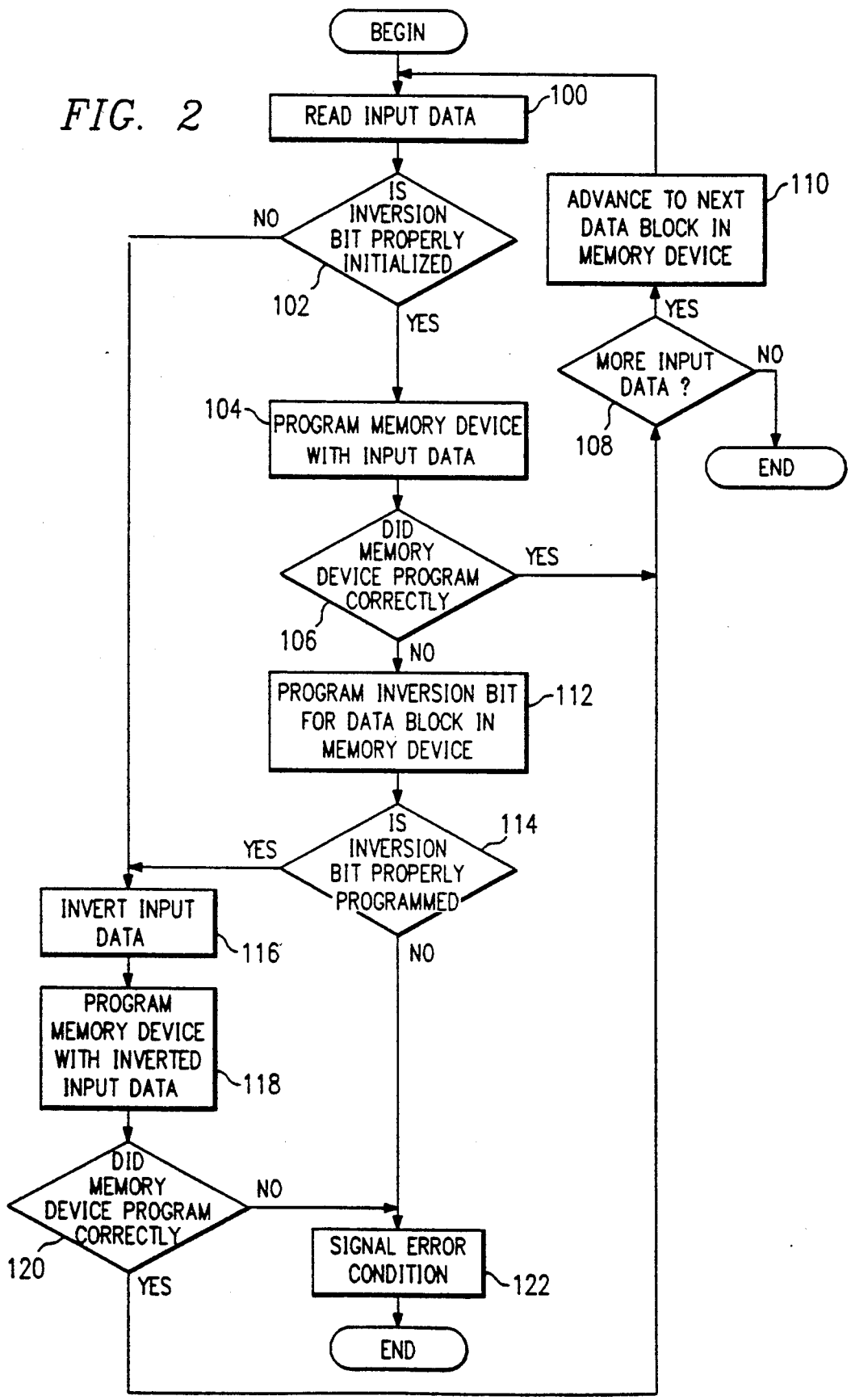

TO FIG. 4b

METHOD AND CIRCUITRY FOR MASKING DATA IN A MEMORY DEVICE

TECHNICAL FIELD OF THE INVENTION

This invention relates in general to memory devices and in particular to a method and circuitry for masking data in a memory device.

BACKGROUND OF THE INVENTION

Many types of memory devices exist, including read-only memory (ROM), erasable programmable read-only memory (EPROM), flash EPROM, electrically erasable programmable read-only memory (EEPROM), flash EEPROM, static random access memory (SRAM), and dynamic random access memory (DRAM). Occasionally, one or more bits in a memory device may become non-programmable or non-erasable, resulting in one or more bit failures in the memory device. When a bit failure occurs in a memory device, the memory device is typically discarded. If memory devices could be used despite bit failures, then the wasteful discarding of memory devices could be avoided, thereby reducing costs and increasing efficiency of processes incorporating memory devices.

In typical 256 kilobyte through 1 megabyte memory device arrays, approximately two to ten bit failures may sometimes exist, usually resulting from processing defects in manufacturing the memory devices. For example, particulate matter may electrically couple two or more lines which are designed to be isolated. Such electrical coupling may also result from lithographic defects such as improper semiconductor masks or semiconductor masks that are improperly aligned. Also, excessive leakage in a floating gate may cause a bit failure.

To be cost effective, a solution to this problem preferably requires minimum surface area and logic overhead in the memory device. Consequently, a need has arisen for a method and circuitry for masking data in a memory device, which masks bit failures while requiring minimum surface area and logic overhead in the memory device.

SUMMARY OF THE INVENTION

A method and circuitry for masking data in a memory device detects whether at least one failed bit location within the memory device is equal to a corresponding bit within input data. Data is written to the memory device as selectively inverted from the input data based upon whether the failed bit location is equal to the corresponding bit. An inversion bit within the memory device is selectively set to indicate whether the written data is inverted from the input data.

It is a technical advantage of this aspect of the present invention that bit failures are masked while requiring minimum surface area and logic overhead in the memory device.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates a first illustrative embodiment of a method of masking data in a memory device;

DETAILED DESCRIPTION OF THE INVENTION

The preferred embodiment of the present invention and its advantages are best understood by referring to FIGS. 1-5 of the drawings, like numerals being used for like and corresponding parts of the various drawings.

Figure 1:
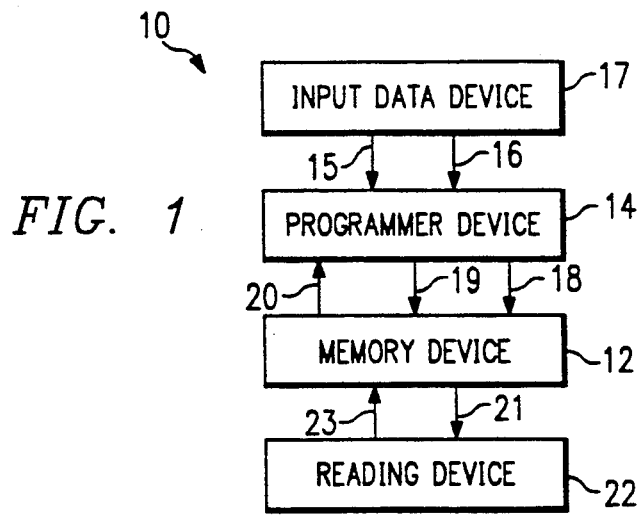
FIG. 1 illustrates a block diagram of hardware comprising circuitry for masking data in a memory device.

FIG. 1 illustrates a block diagram of hardware 10 comprising circuitry for masking data in memory device 12. Programmer device 14 reads input data 16 from input data device 17. Input data device 17 may also specify address 15 at which input data 16 ultimately are to be stored in memory device 12. Programmer device 14 may then provide memory device 12 with input data 16 using path 18. Programmer device 14 may also specify an address at which input data 16 is to be stored in memory device 12 using path 19 and may also read data stored by memory device 12 at the specified address using path 20. After memory device 12 is programmed with input data 16, reading device 22 may specify an address to memory device 12 using path 23 and may then read data stored by memory device 12 at the specified address using path 21. Circuitry for masking data in memory device 12 may be integral either with memory device 12 or with programmer device 14. Moreover, circuitry for reading masked data from memory device 12 may be integral either with memory device 12 or with reading device 22. In the preferred embodiment, circuitry for masking data in memory device 12 implements approaches described further hereinbelow in connection with FIGS. 2-5.

Memory device 12 may be utilized despite the presence of bit failures if the bit failures are appropriately masked. When a failure occurs at a particular bit location, typically the bit location is permanently fixed in either a programmed (e.g. "1") or an erased (e.g. "0") state. The failed bit location is usually one of several bit locations which collectively form a data block, such as an 8-bit byte, 16-bit word, 32-bit word, an entire wordline of memory device 12, or any other block length appropriate for a particular application.

In an important aspect of the preferred embodiment, each such data block within memory device 12 has an associated data inversion bit. The data inversion bit may be programmed or erased depending upon whether a bit location within the data block has failed, upon whether the failed bit location is fixed in a "1" or "0" state, and upon whether a "1" or "0" is to be stored at the failed bit location. For example, if the failed bit location is fixed in a "1" state, and if a "1" is to be stored at the failed bit location, then the data inversion bit is erased for the data block containing the failed bit location. Similarly, if the failed bit location is fixed in a "0" state, and if a "0" is to be stored at the failed bit location, then the data inversion bit is erased for the data block containing the failed bit location. Otherwise, the data inversion bit is programmed for the data block containing the failed bit location.

When the data inversion bit is programmed for a particular data block, all input data bits are stored in the data block in an inverted state, such that the input data bit actually stored in a failed bit location matches the fixed state ("1" or "0") of the failed bit location. Upon reading a data block for which the associated data inversion bit is programmed, all bits of the data block are inverted prior to being output. When the data inversion bit is erased for a particular data block, all input data bits are stored in the particular data block and subsequently read in the same manner as if no bit failures existed within the data block.

FIG. 2 illustrates a first illustrative embodiment of a method of masking data in memory device 12. The method of FIG. 2 is applicable to memory devices having data blocks which may be individually written more than once, such as DRAM, SRAM, EEPROM, flash EEPROM, and flash EPROM devices. Beginning with a first data block (not shown) in memory device 12 (FIG. 1), Step 100 reads input data which is to be stored in the first data block in memory device 12. Step 102 determines whether the inversion bit associated with the first data block is properly initialized. In the preferred embodiment, the inversion bit is initially placed in an "0" state to indicate non-inverted data. Consequently, the inversion bit is properly initialized if it is in a "0" state. In an alternative embodiment, the inversion bit may be properly initialized in a "1" state, such that a "1" indicates non-inverted data. If Step 102 determines that the inversion bit is not properly initialized, then control passes to Step 116 discussed further hereinbelow. If the inversion bit is properly initialized, then Step 104 programs the first data block in memory device 12 with the input data. Step 106 determines whether the first data block programmed correctly, as in whether the first data block properly stored the programmed input data. This may be accomplished by reading the programmed memory and comparing the read data to the input data. If the current block of memory device 12 programmed correctly, then Step 108 determines whether more input data are available for storage in memory device 12. If more input data are available, then Step 110 advances to the next data block in memory device 12, and programming is repeated in Step 100 for the next input data. If Step 108 determines that more input data are not available, then the programming operation ends.

If Step 106 determines that memory device 12 did not program correctly, then Step 112 programs the inversion bit associated with the data block. Then, Step 114 determines whether the inversion bit is properly programmed. If the inversion bit is properly programmed, then Step 116 inverts the input data, and Step 118 programs the current data block of memory device 12 with the inverted input data. Step 120 then determines whether memory device 12 data block programmed correctly. If memory device 12 did program correctly, then control passes to Step 108. Otherwise, control passes to Step 122, which signals an error condition and then ends the programming operation. Also, if Step 114 determines that the inversion bit is not properly programmed, then control passes to Step 122.

Thus, the method of FIG. 2 first attempts to program a data block of memory device 12 with the input data. In this manner, failed bits of the data block may be compared against their corresponding bits within the input data, since the data block will properly store the input data if the failed bits are equal to their corresponding bits within the input data. If the data block fails to properly store the input data, then an inversion bit is programmed and the input data is inverted and again stored in the data block. In this manner, failed bits of the data block may be compared against their corresponding bits within the inverted input data, since the data block will properly store the inverted input data if the failed bits are equal to their corresponding bits within the inverted input data. If the data block again fails by improperly storing the inverted input data, then an error condition is signaled. Such a failure situation might result if a failing bit of the data block unpredictably varies between a "1" state and a "0" state. Such a failure situation might also result if a first data bit in the data block is fixed in a state opposite its corresponding bit within the input data, while a second bit of the data block is fixed in a state equal to its corresponding bit within the input data. For example, if bit 2 of an 8-bit data block is fixed in a "0" state while bit 5 of the data block is fixed in a "1" state (i.e. data block is "XX1XX0XX" where each "X" denotes a bit location which is not fixed), and if bit 2 of the input data is a "0" (equal to its corresponding bit within the data block) while bit 5 of the input data is also a "0" (opposite its corresponding bit within the data block), (i.e., input data is "XX0XX0XX" where each "X" denotes a bit location which may be either an "0" or a "1"), then the data block will properly store neither the non-inverted nor the inverted forms of the input data.

Nevertheless, the method of FIG. 2 may properly mask data in memory device 12 despite the presence of more than one failed bit location within the data block, if all failed bit locations are equal to their respective corresponding bits within the input data, or if all failed bit locations are opposite their respective corresponding bits within the input data. Moreover, the method of FIG. 2 may properly mask data when an associated inversion bit is not properly initialized, if all failed bit locations of the data block are opposite their respective corresponding bits within the input data.

Figure 3:
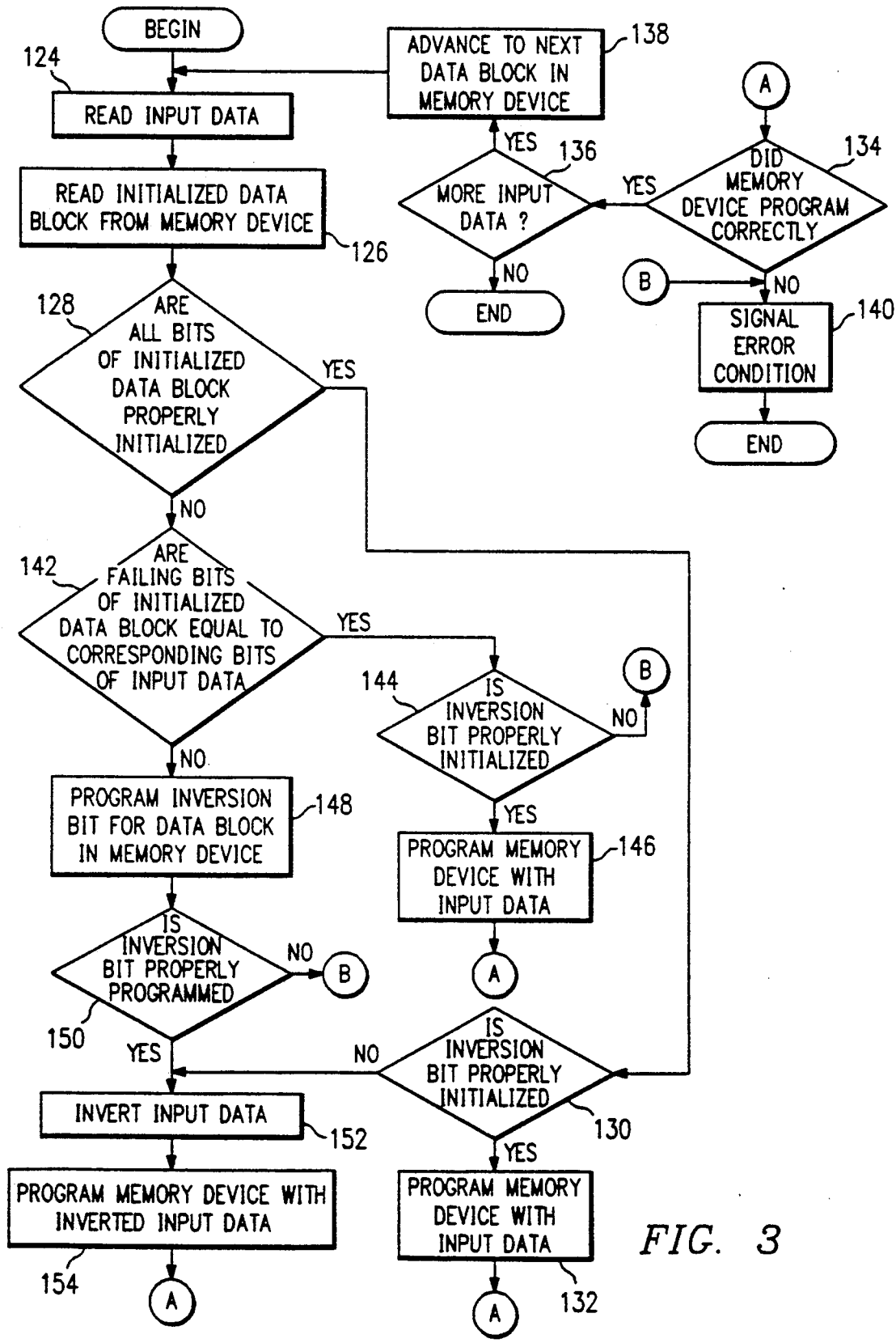
FIG. 3 illustrates a second illustrative embodiment of a method of masking data in a memory device.

If data blocks in memory device 12 are not individually reprogrammable, then the method of FIG. 2 is not preferred. In such cases, a second illustrative embodiment illustrated by the method of FIG. 3 is preferred. This second method is useful for such devices as ROM and ultraviolet light EPROM devices. In an overview of FIG. 3, the method first determines whether the data block of memory device 12 is properly initialized. In the preferred embodiment, each bit within the data block is initially placed in an "0" state; consequently, the data block is properly initialized if each bit within the data block is in an "0" state. In an alternative embodiment, the data block may be properly initialized by each bit within the data block being initially placed in a "1" state. If the data block is not properly initialized, then the method determines whether the improperly initialized bit locations of the data block are fixed in a state equal to their respective corresponding bits within the input data. Based upon these determinations, the method programs memory device 12 with either inverted or non-inverted input data. However, if memory device 12 fails to program properly, then no further corrective action may be taken on individual data blocks in ROM and EPROM devices. Such a situation might occur when a bit location in the data block is properly initialized, yet fails to program properly because it is fixed in the initialized state.

In FIG. 3, Step 124 reads input data which is to be stored in memory device 12. Prior to storing the input data, Step 126 reads the initialized data block from memory device 12, and Step 128 determines whether all bits of the initialized data block are properly initialized.

If all bits of the initialized data block are properly initialized, then Step 130 determines whether the inversion bit associated with the initialized data block is properly initialized. If the associated inversion bit is not properly initialized, then control passes to Step 152, discussed further below. However, if the associated inversion bit is properly initialized, then Step 132 programs memory device 12 data block with the input data. Then, Step 134 determines whether the current block of memory device 12 programmed correctly. If memory device 12 failed to program correctly, then Step 140 signals an error condition, and the programming operation ends. If Step 134 determines that memory device 12 did program correctly, then Step 136 determines whether more input data are available for storage in memory device 12. If more input data are available, then Step 138 advances to the next data block in memory device 12, and programming continues with the next data block at Step 124. If Step 136 determines that more input data are not available, then the programming operation ends.

If Step 128 determines that all bits of the initialized data block are not properly initialized, then Step 142 determines whether failing bit locations of the initialized data block are equal to their respective corresponding bits within the input data. If the failing bit locations of the initialized data block are equal to their respective corresponding bits within the input data, then Step 144 determines whether the inversion bit associated with the initialized data block is properly initialized. If the inversion bit is properly initialized, then Step 146 programs memory device 12 data block with the input data, and control passes to Step 134. If Step 144 determines that the inversion bit is not properly initialized, then control passes to Step 140.

If Step 142 determines that the failing bit locations of the initialized data block are not equal to their respective corresponding bits within the input data, then Step 148 programs the inversion bit associated with the initialized data block. Then, Step 150 determines whether the inversion bit is properly programmed; if not, control passes to Step 140. If the inversion bit did properly program, then Step 152 inverts the input data, and Step 154 programs memory device 12 data block with the inverted input data. Then, control passes to Step 134.

Figure 4A:
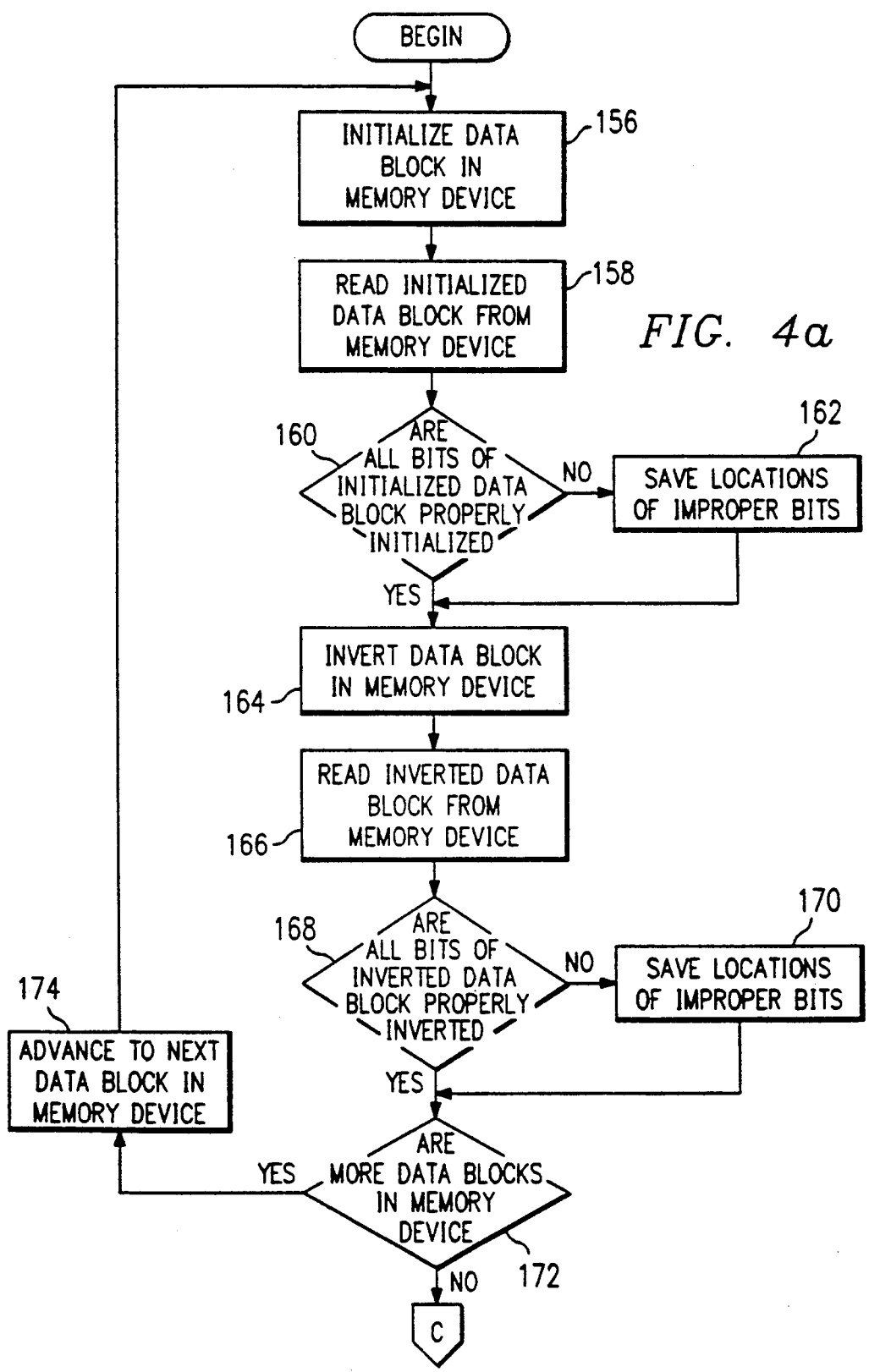
FIGS. 4a-b illustrate a third illustrative embodiment of a method of masking data in a memory device.
Figure 4B:
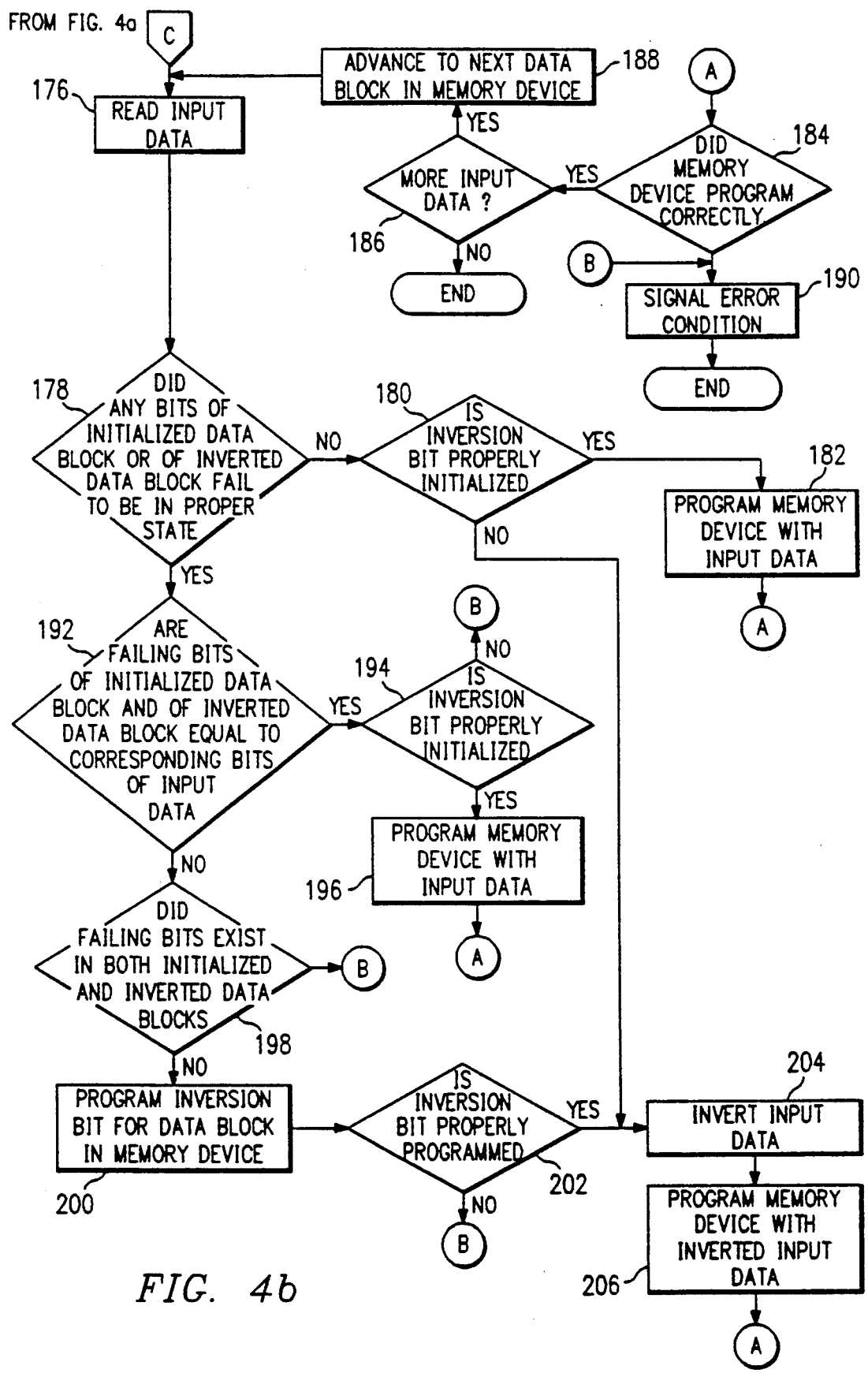

FIGS. 4a–b illustrate a third embodiment of a method of masking data in memory device 12. The method of FIGS. 4a–b is preferred when applied to flash EPROM and flash EEPROM devices having individually erasable sectors larger than the data blocks to be programmed. For example, a flash memory device may only be erasable on a wordline basis. However, several data blocks might exist within each wordline, with each data block having an associated inversion bit. Consequently, it is desirable to determine whether any data block's associated inversion bit should be programmed before programming any other data blocks within the wordline (or other erasable sector of a flash memory device); otherwise, several data blocks within the wordline might be programmed only to later discover that a subsequent data block failed to program correctly, thereby requiring the entire wordline (or other erasable sector in a flash memory device) to be erased and reprogrammed, even though only a single data block failed to program correctly.

In determining whether any data block's associated inversion bit should be programmed before programming any of the data blocks within the erasable sector, the preferred approach is to first determine whether all data blocks within the entire memory device are properly initialized. Then, each data block within memory device 12 is inverted from its initialized state, and each data block is checked to determine whether it successfully inverted. In this manner, failed bit locations may be identified regardless of whether they are fixed in a "1" state or a "0" state. In an alternative embodiment, any failed bit locations are identified for all data blocks only within an erasable sector prior to programming data blocks within that erasable sector, rather than being identified for all data blocks within the entire memory device prior to programming any data blocks within memory device 12.

In FIG. 4a, Step 156 initializes a data block in memory device 12, and Step 158 then reads the initialized data block from memory device 12. Step 160 determines whether all bits of the initialized data block are properly initialized; if not, then Step 162 saves indices to the locations of the bits which failed to properly initialize. Control then passes to Step 164. If Step 160 determines that all bits of the initialized data block are properly initialized, then control passes directly to Step 164, which inverts the data block in memory device 12. Step 166 then reads the inverted data block from memory device 12, and Step 168 determines whether all bits of the inverted data block successfully inverted; if not, then Step 170 saves indices to the locations of bits which failed to successfully invert. Control then passes to Step 172. If Step 168 determines that all bits of the inverted data block successfully inverted, then control passes directly to Step 172, which determines whether more data blocks are present in memory device 12. If more data blocks are present in memory device 12, then Step 174 advances to the next data block in memory device 12, and control passes to Step 156. In this manner, each data block in memory device 12 is checked to determine whether any bit locations are fixed in a "1" or a "0" state, before any input data are programmed into memory device 12.

If Step 172 determines that more data blocks are not present in memory device 12, then control passes to Step 176 in FIG. 4b, which reads input data which is to be stored in memory device 12. Step 178 then determines whether any bits of the initialized data block or of the inverted data block failed to be in their proper states, as determined by Steps 156 through 174 of FIG. 4a. If neither bits of the initialized data block nor of the inverted data block failed to be in their proper states, then Step 180 determines whether the inversion bit associated with the particular data block is properly initialized; if yes, then Step 182 programs memory device 12 data block with the input data. Step 184 then determines whether memory device 12 programmed correctly; if yes, then Step 186 determines whether more input data are available for storage in memory device 12. If more input data are available for storage, then Step 188 advances to the next data block in memory device 12, and control passes to Step 176, which repeats the programming operation for the next data block in memory device 12.

If Step 186 determines that no more input data are available, then the programming operation ends. If Step 184 determines that memory device 12 failed to program correctly, then Step 190 signals an error condition, and the programming operation ends. If Step 180 determines that the inversion bit is not properly initialized, then the programming operation proceeds as if the inversion bit were programmed, and control passes to Step 204 discussed further hereinbelow.

If Step 178 determines that one or more bits of the initialized data block or of the inverted data block failed to be in its proper state, then Step 192 determines whether the failing bits of the initialized data block and of the inverted data block are equal to their respective corresponding bits within the input data; if yes, then Step 194 determines whether the inversion bit associated with memory device 12 data block is properly initialized. If the data block's associated inversion bit is properly initialized, then Step 196 programs memory device 12 data block with the input data, and control passes to Step 184. If Step 194 determines that an inversion bit is not properly initialized, then control passes to Step 190.

If Step 192 determines that failing bits of either the initialized data block or of the inverted data block are not equal to their respective corresponding bits within the input data, then Step 198 determines whether failing bits existed in both the initialized data block and the inverted data block; if yes, then control passes to Step 190 which signals an error condition. If Step 198 determines that failing bits existed in only the initialized data block or in only the inverted data block, then the input data may be inverted to mask any failing bits. Accordingly, Step 200 programs the inversion bit associated with the memory device 12 data block, and Step 202 determines whether the inversion bit is properly programmed. If the inversion bit failed to properly program, then control passes to Step 190, which signals an error condition. Otherwise, if Step 202 determines that the inversion bit did properly program, then control passes to Step 204 which inverts the input data. Then, Step 206 programs memory device 12 data block with the inverted input data, and control passes to Step 184.

Figure 5:
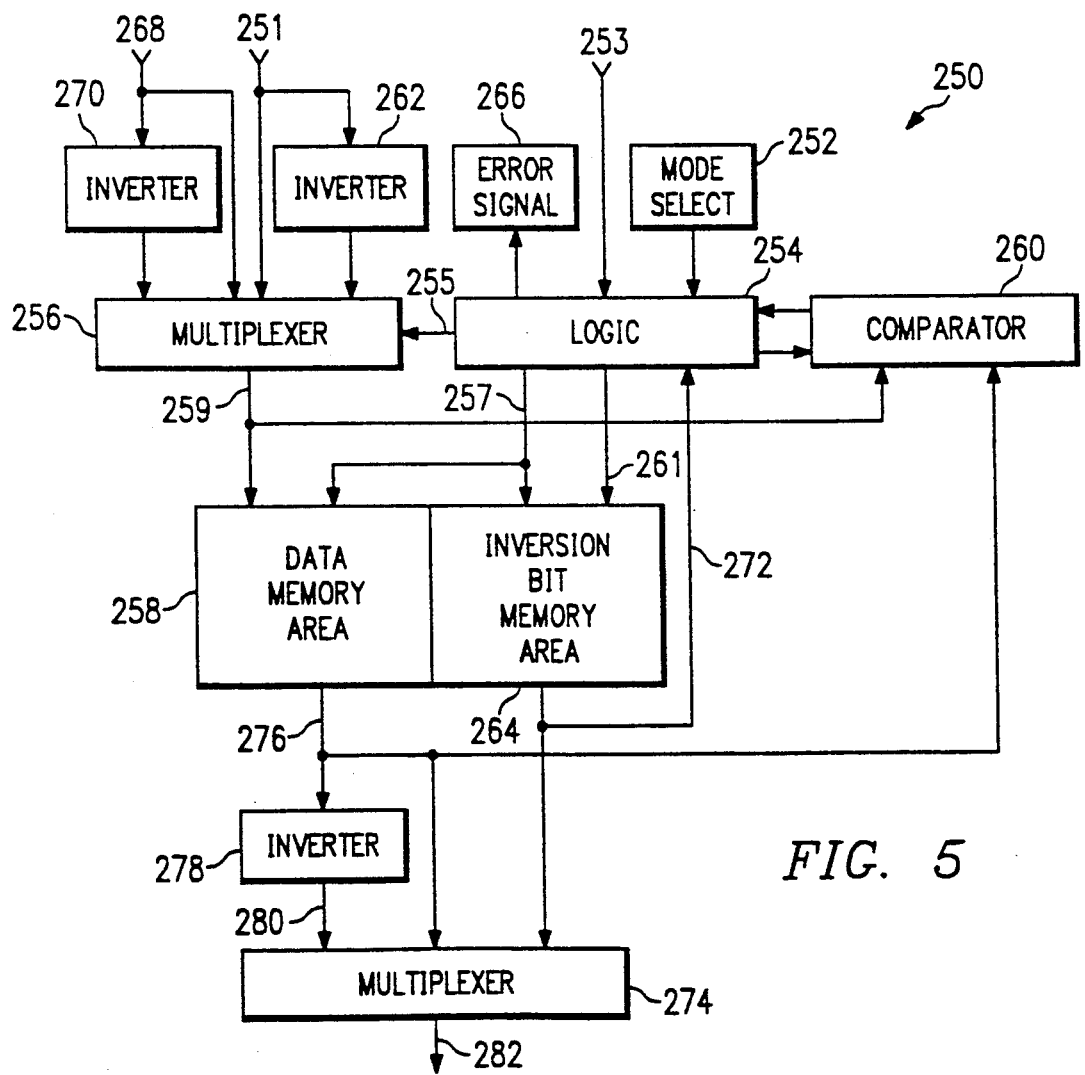
FIG. 5 illustrates a block diagram of circuitry for masking data in a memory device.

FIG. 5 illustrates a block diagram of circuitry 250 for masking data in memory device 12 (FIG. 1). Mode select switch 252 specifies to logic circuitry 254 which of the approaches described hereinabove in connection with FIGS. 2-4 is to be executed. For example, if the approach of FIG. 2 is to be executed, then logic circuitry 254 is instructed accordingly by mode select switch 252.

In executing the approach of FIG. 2, logic 254 uses path 255 to instruct multiplexer 256 to provide input data 251 over path 259 for storage in data memory area 258 of memory device 12 (FIG. 1). A particular data block within data memory area 258 is specified by an address provided to data memory area 258 by logic 254 using path 257. Path 257 also provides the address to inversion bit memory area 264, thereby specifying an inversion bit associated with the particular data block. Logic 254 itself receives an address from path 253. In the preferred embodiment, circuitry 250 is integral with memory device 12; in that case, input data 251 and path 253 correspond to paths 18 and 19, respectively, of FIG. 1.

In an alternative embodiment, circuitry 250 may be integral with programmer device 14; in that case, input data 251 and path 253 correspond to input data 16 and address 15, respectively, of FIG. 1; also, paths 259 and 261 together correspond to path 18 of FIG. 1; accordingly, path 257 corresponds to path 19 of FIG. 1.

In executing the approach of FIG. 2, logic 254 uses path 272 to determine whether the addressed inversion bit within inversion bit memory area 264 is properly initialized. Logic 254 also uses paths 255 and 257 to write input data 251 into an addressed data block within data memory area 258. Comparator 260 receives input data 251 from multiplexer 256 using path 259, and comparator 260 then indicates to logic 254 whether input data 251 are properly stored in the addressed data block of data memory area 258.

If input data 251 are not properly stored in the addressed data block, then logic 254 uses paths 255 and 257 to write inverted input data from inverter 262 into the addressed data block; logic 254 also uses path 261 to program the addressed associated inversion bit within inversion bit memory area 264. Comparator 260 receives the inverted input data from multiplexer 256 using path 259, and comparator 260 then indicates to logic 254 whether the inverted input data are properly stored in the addressed data block of data memory area 258. Moreover, logic 254 uses path 272 to determine whether the addressed inversion bit is properly programmed. If the inverted input data are not properly stored in the addressed data block, or if the addressed inversion bit is not properly programmed, then logic 254 instructs error signal 266 to signal an error condition.

Mode select 252 may also instruct logic 254 to execute the approaches of either FIGS. 3 or 4. In executing these alternative approaches, logic 254 may further instruct multiplexer 256 to provide initial data 268 for storage in data memory area 258 and also for comparison by comparator 260 against data stored in data memory area 258. In the preferred embodiment, initial data 268 is hard-wired within circuitry 250. Similarly, logic 254 may further instruct multiplexer 256 to provide inverted initial data from inverter 270 to data memory area 258 and to comparator 260. As previously discussed, logic 254 may specify an address to data and inversion bit memory areas 258 and 264 using path 257, such that data stored in the addressed data block within data memory area 258 is provided to comparator 260 for comparison against data provided by multiplexer 256, and such that logic 254 may determine a state of the addressed associated inversion bit within inversion bit memory area 264. Moreover, comparator 260 may further indicate to logic 254 which particular bits of data stored in the addressed data block failed to equal data provided by multiplexer 256. Also, logic 254 may internally save indices to locations of the particular bits indicated by comparator 260; the indices further indicate values stored in the particular failed bits of the addressed data block, as provided by comparator 260.

In executing the approach of FIG. 3, comparator 260 may for example compare initial data 268 against data stored in the addressed initialized data block in order to detect failed bit locations within the initialized data block; if failed bit locations exist, then comparator 260 may compare input data 251 against data stored in the initialized data block to determine whether input data 251 should be inverted prior to being stored in the addressed data block.

In executing the approach of FIGS. 4a-b, logic 254 may for example use paths 255 and 257 to write initial data 268 into an addressed data block within data memory area 258. Comparator 260 may then compare initial data 268 against data stored in the addressed initialized data block in order to detect failed bit locations within the initialized data block; if failed bit locations exist, then logic 254 internally saves indices to the particular bit locations which have failed, as indicated by comparator 260. Likewise, logic 254 may write inverted initial data into the addressed data block, and comparator 260 may indicate which bit locations within the addressed data block failed to properly store the inverted initial data; logic 254 may then internally save indices to those failed bit locations. Subsequently, logic 254 may retrieve the saved indices to the failed bit locations and may provide values of the failed bit locations to comparator 260 which determines whether the failing bits are equal to their respective corresponding bits within input data 251, in order to determine whether input data 251 should be inverted prior to being stored in the addressed data block.

After data and inversion bit memory areas 258 and 264 of memory device 12 have been programmed according to the approaches described hereinabove, data stored in an addressed data block of data memory area 258 may be subsequently read based upon whether the addressed data block's associated inversion bit is programmed. Multiplexer 274 receives data stored in the addressed data block from data memory area 258 using path 276. Path 276 further provides inverter 278 with data stored in the addressed data block. Path 280 provides inverted data from inverter 278 to multiplexer 274. Multiplexer 274 further receives the associated inversion bit output from inversion bit memory area 264 using path 272. Based upon whether the associated inversion bit is programmed, multiplexer 274 outputs on path 282 either the non-inverted data block from path 276 or the inverted data block from path 280. In the preferred embodiment, inverter 278 and multiplexer 282 are integral with memory device 12 (FIG. 1); in that case, path 282 corresponds to path 21 of FIG. 1. In an alternative embodiment, inverter 278 and multiplexer 282 are integral with reading device 22 (FIG. 1); in that case, paths 276 and 272 together correspond to path 21 of FIG. 1. In both cases, reading device 22 may specify an address to data and inversion bit memory areas 258 and 264 of memory device 12 using a path (not shown in FIG. 5) which corresponds to path 23 of FIG. 1.

When the inversion operation is performed in hardware during a read operation, the speed impact penalty is a one gate delay for an inverted data block. By implementing the circuitry for masking data on an integrated circuit, a minimum surface area may be achieved. Also, hardware redundancy overhead may be minimized by sharing a single inversion bit across multiple data blocks, as for example when a single inversion bit is shared among several data blocks which form one wordline in memory device 12.

Although the present invention and its advantages have been described in detail, it should be understood that various changes, substitutions and alterations can be made herein without departing from the spirit and scope of the invention as defined by the appended claims.

What is claimed is:

1. Circuitry for masking data in a memory device, comprising:

detection circuitry coupled to the memory device for detecting whether the data state of at least one failed bit location within the memory device is equal to the data state of a corresponding bit within input data;

selection circuitry coupled to said detection circuitry and to the memory device for writing data to the memory device, said data selectively inverted from said input data based upon an output of said detection circuitry and for selectively setting an inversion bit within the memory device to indicate whether said written data is inverted from said input data; and test circuitry coupled to the memory device for reading the memory device to determine whether said written data and said selectively set inversion bit are properly stored in the memory device.

2. The circuitry of claim 1 and further comprising signal circuitry coupled to said test circuitry for signalling an error condition if any said written data and said selectively set inversion bit are not properly stored in the memory device.

* * * * *